United States Patent
Lin et al.

(10) Patent No.: US 8,486,744 B2
(45) Date of Patent: Jul. 16, 2013

(54) MULTIPLE BONDING IN WAFER LEVEL PACKAGING

(75) Inventors: Chung-Hsien Lin, Hsinchu (TW);
Chia-Hua Chu, Zhubei (TW);
Li-Cheng Chu, Taipei (TW);
Yuan-Chih Hsieh, Hsinchu (TW);
Chun-Wen Cheng, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 112 days.

(21) Appl. No.: 12/892,003

(22) Filed: Sep. 28, 2010

(65) Prior Publication Data

US 2012/0074590 A1 Mar. 29, 2012

(51) Int. Cl.
*H01L 21/00* (2006.01)

(52) U.S. Cl.
USPC ............. 438/50; 257/414; 257/415; 257/416; 257/704; 257/773; 257/E23.124; 257/E23.125; 257/E23.128; 257/E21.499; 257/E21.5; 438/48; 438/51; 438/52; 438/53; 438/118; 438/455; 438/456; 73/488; 73/493; 73/504.12; 73/514.16; 174/50.5; 174/50.51; 174/50.54; 174/50.61; 174/150; 335/151

(58) Field of Classification Search
USPC ............... 257/414–416, 704, 773, E23.124, 257/E23.125, E23.128, E21.499, E21.5; 438/48, 438/50–53, 105, 118, 455, 456; 73/488, 493, 73/504.4, 504.12, 514.16; 147/50.5, 50.51, 147/50.54, 50.61, 150; 335/151
See application file for complete search history.

(56) References Cited

U.S. PATENT DOCUMENTS

| | | | |
|---|---|---|---|
| 2003/0119278 A1* | 6/2003 | McKinnell | 438/455 |
| 2007/0029629 A1* | 2/2007 | Yazdi | 257/414 |
| 2012/0025389 A1* | 2/2012 | Chu et al. | 257/773 |

* cited by examiner

*Primary Examiner* — Meiya Li
(74) *Attorney, Agent, or Firm* — Haynes and Boone, LLP

(57) ABSTRACT

The present disclosure provides a method for fabricating a MEMS device including multiple bonding of substrates. In an embodiment, a method includes providing a micro-electromechanical systems (MEMS) substrate including a first bonding layer, providing a semiconductor substrate including a second bonding layer, and providing a cap including a third bonding layer. The method further includes bonding the MEMS substrate to the semiconductor substrate at the first and second bonding layers, and bonding the cap to the semiconductor substrate at the second and third bonding layers to hermetically seal the MEMS substrate between the cap and the semiconductor substrate. A MEMS device fabricated by the above method is also provided.

20 Claims, 9 Drawing Sheets

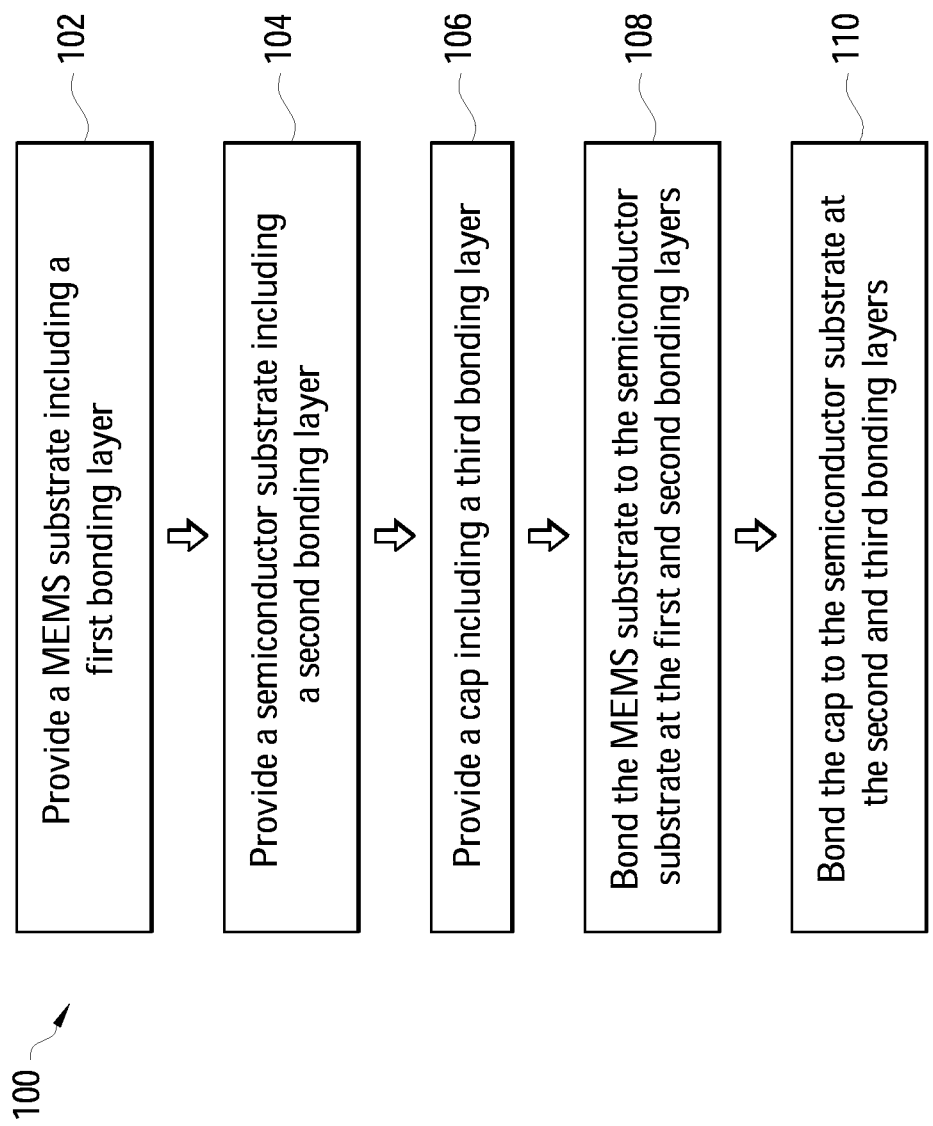

MULTIPLE BONDING IN WAFER LEVEL PACKAGING

BACKGROUND

Wafer level packaging (WLP) technology provides for the packaging of semiconductor devices at a wafer level. WLP is employed in a variety of technologies including 3D-integrated circuits (IC), chip scale package (CSP) devices, and micro-electro-mechanical systems (MEMS). Potential advantages of using WLP technology include enhancing electrical properties, providing for increased density, reducing device sizes, reducing costs, and allowing for additional testing at wafer level. However, there are several limitations to the current WLP technology and the integration of the wafer fabrication and packaging processes it provides. The methods of packaging (e.g., protecting the device and providing interconnections to the outside world) may not be compatible with the fabrication processes that are used to form the devices. For example, certain bonding materials have not been compatible with some fabrication processes (e.g., complementary metal-oxide semiconductor (CMOS)). Furthermore, prior WLP solutions have been limited to capping thin MEMS layers, have increased leakage pathways, and have disadvantageous bonding effects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1 is a flowchart of an embodiment of a method for fabricating a MEMS device including multiple bonding of substrates.

DETAILED DESCRIPTION

Figure 2A:
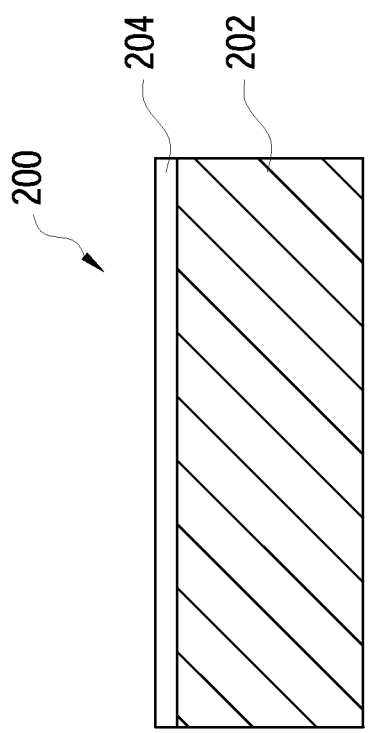
FIGS. 2A-2G are cross-sectional views of a MEMS device at various stages of fabrication according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

It is understood that several processing steps and/or features of a device may be only briefly described, such steps and/or features being well known to those of ordinary skill in the art. Also, additional processing steps or features can be added, and certain of the following processing steps or features can be removed and/or changed while still implementing the claims. Thus, the following description should be understood to represent examples only, and are not intended to suggest that one or more steps or features is required.

It is further understood that the present disclosure refers generally to wafer level packaging (WLP) to refer to the packaging of a substrate. The substrates described herein may take various forms including but not limited to wafers (or portions thereof) having integrated circuits including those formed by CMOS-based processes, die, MEMS substrates, capping substrates, a single substrate with CMOS devices and MEMS devices formed thereon, and the like. Furthermore, as described above, specific embodiments may be described herein which are exemplary only and not intended to be limiting. For example, embodiments that refer to a substrate being a MEMS substrate, a CMOS substrate, or the like are exemplary only and not intended to limit the disclosure to any particular technology.

Referring now to FIG. 1, a flowchart is illustrated of an embodiment of a method for fabricating a MEMS device including multiple bonding of substrates. The method 100 begins at block 102, wherein a MEMS substrate including a first bonding layer is provided. A substrate including a MEMS device may be referred to herein as a MEMS substrate. Accordingly, the MEMS substrate provided includes a MEMS device or portion thereof. The MEMS substrate may be a silicon wafer including MEMS devices, features and/or functionalities. The MEMS substrate may be a wafer or combination of wafers (including portions thereof) including MEMS features and functionality. The MEMS substrate may alternatively or additionally include other elementary semiconductor, such as germanium. The MEMS substrate may also include a compound semiconductor, such as silicon carbide, gallium arsenic, indium arsenide, indium phosphide, or the like.

The MEMS substrate includes a first bonding layer. In an embodiment, the first bonding layer includes silicon. Examples of the first bonding layer compositions include amorphous silicon, polysilicon, a combination of amorphous silicon and polysilicon, silicon doped with one or more impurities, and other suitable substantially silicon-based compositions. The first bonding layer may be formed by physical vapor deposition (PVD), chemical vapor deposition (CVD), evaporation, electron beam evaporation (E-gun), ion beam, energy beam, combinations thereof, and/or other suitable deposition processes. Other manufacturing techniques used to form the first bonding layer may include photolithography processing and/or etching to pattern the bonding layer. In an embodiment, the first bonding layer is formed and subsequently or concurrently doped with impurities. The doping may be performed in order to enhance the electrical performance of the associated device (e.g., to decrease the bias). Example impurities include boron, phosphorus, arsenic, and/or other suitable dopants known in the art.

In an embodiment, the first bonding layer, or portion thereof, is included in the MEMS device. In an alternative embodiment, the first bonding layer is formed on the MEMS substrate after completing the fabrication of the MEMS device. In an embodiment, the first bonding layer may be a substantially silicon-based layer as noted above. For example, the substantially silicon-based layer may include amorphous silicon and/or polysilicon. In an alternative embodiment, the first bonding layer may be a substantially aluminum-based layer. In other embodiments, the first bonding layer may be comprised of titanium, nickel, silicon, alloys thereof, or combinations thereof.

The method 100 continues to block 104, wherein a semiconductor substrate including a second bonding layer is provided. The semiconductor substrate provided includes a semiconductor device such as an integrated circuit (IC) including a metal-insulator-semiconductor field effect transistor (MOSFET) including complementary MOSFET (CMOS), a CMOS imaging sensor (CIS), a MEMS, and/or other suitable active and/or passive devices. In an embodiment, the semiconductor substrate includes an IC (or portion thereof) designed and formed by a CMOS-based process(es). This may be referred to herein as a CMOS substrate or CMOS device. The CMOS substrate may be any substrate (e.g., wafer) with one or more semiconductor devices implemented (e.g., designed and fabricated) by a CMOS-based technology formed thereon. A semiconductor substrate including a device formed using other semiconductor fabrication technologies is also within the scope of the described method and present disclosure. In one example, the semiconductor substrate is a silicon wafer. The semiconductor substrate may alternatively or additionally include other elementary semiconductor, such as germanium. The semiconductor substrate may also include a compound semiconductor, such as silicon carbide, gallium arsenic, indium arsenide, indium phosphide, or the like. The semiconductor substrate typically includes a plurality of features formed thereon providing a semiconductor device or portion thereof.

The semiconductor substrate includes a second bonding layer. In an embodiment, the second bonding layer includes aluminum. Example compositions of the second bonding layer include an aluminum alloy with copper, an aluminum alloy with copper and silicon, and/or other suitable substantially aluminum-based compositions. The substantially aluminum-based second bonding layer may be formed by CVD, physical vapor deposition (sputtering), plating, and/or other suitable processes. Other manufacturing techniques to form the bonding layer may include photolithography processing and/or etching to pattern the bonding layer. In an embodiment, the second bonding layer, or portion thereof, is part of a multilayer interconnect (MLI) structure of a semiconductor device. The MLI includes horizontal conductive features (metal lines) disposed at multiple metal layers and vertical conductive features, such as contacts and vias. A via is configured to connect two metal lines at different metal layers. A contact is configured to connect a metal line and the substrate.

In an embodiment, the second bonding layer is formed as part of a semiconductor device disposed on the CMOS substrate (e.g., is part of an MLI). In an embodiment, the second bonding layer may be a substantially aluminum-based layer as noted above. In alternative embodiments, the second bonding layer may be comprised of titanium, nickel, copper, gold, silver, indium, tin, alloys thereof, or combinations thereof. In yet another embodiment, the second bonding layer may be a substantially silicon-based layer.

The method 100 then proceeds to block 106, wherein a cap including a third bonding layer is provided. In one embodiment, the cap includes stand-off features to enclose and provide a cavity for the enclosed MEMS device. In one embodiment, the cap does not include an integrated circuit. The cap may be comprised of silicon or other elementary semiconductor, such as germanium. The cap may also be comprised of a compound semiconductor, such as silicon carbide, gallium arsenic, indium arsenide, indium phosphide, and the like.

The cap includes a third bonding layer. In an embodiment, the third bonding layer includes silicon. Examples of the third bonding layer compositions include amorphous silicon, polysilicon, a combination of amorphous silicon and polysilicon, silicon doped with one or more impurities, and other suitable substantially silicon-based compositions. The third bonding layer may be formed by physical vapor deposition (PVD), chemical vapor deposition (CVD), evaporation, electron beam evaporation (E-gun), ion beam, energy beam, combinations thereof, and/or other suitable deposition processes. Other manufacturing techniques used to form the third bonding layer may include photolithography processing and/or etching to pattern the bonding layer. In other embodiments, the third bonding layer may be comprised of germanium.

The method 100 then proceeds to block 108, wherein a bonding process is performed between the semiconductor substrate and the MEMS substrate. In particular, the first bonding layer of the MEMS substrate provided in block 102 is bonded with the second bonding layer of the semiconductor substrate provided in block 104. In doing so, the semiconductor substrate and the MEMS substrate are physically bonded (e.g., coupled). The bonding may be provided by a solid-phase reaction. In one example, a eutectic bond or a diffusion bond bonds the first and second bonding layers. In an embodiment, the bonding provides an electrical interface between the semiconductor substrate and the MEMS substrate (or devices formed thereon) at one or more bonding regions (e.g., regions of physical interface between substrates). In an embodiment, one or more of the bonding layers at a bonding region is formed on a non-conducting layer (e.g., insulating layer) and no electrical interface is provided at that region. In one example, the first bonding layer and the second bonding layer may be comprised of a titanium aluminum alloy and aluminum respectively, nickel and aluminum respectively, silicon and aluminum respectively, or silicon and titanium respectively.

The method 100 then proceeds to block 110, wherein a bonding process is performed between the semiconductor substrate and the cap. In particular, the second bonding layer of the semiconductor substrate provided in block 104 is bonded with the third bonding layer of the cap provided in block 106. In doing so, the semiconductor substrate and the cap are physically bonded (e.g., coupled). The bonding may be provided by a solid-phase reaction. In one example, a eutectic bond or an adhesive bond bonds the second and third bonding layers. In an embodiment, one or more of the bonding layers at a bonding region is formed on a non-conducting layer (e.g., insulating layer) and no electrical interface is provided at that region. The cap bonding to the semiconductor substrate hermetically seals the MEMS substrate within a cavity between the cap and the semiconductor substrate. In one example, the second bonding layer and the third bonding layer may be comprised of aluminum and germanium respectively, an aluminum copper alloy and germanium respectively, a gold alloy and silicon respectively, a silver alloy and silicon respectively, an indium alloy and silicon respectively, or a tin alloy and silicon respectively.

The bonding process described above in blocks 108 and 110 may be performed in the presence of a forming gas and/or another controllable environment. Example forming gases include argon, nitrogen ($N_2$), hydrogen ($H_2$), nitrogen/hydrogen mixture, and/or other suitable gases. The forming gases may serve to de-oxidize the bonding layer(s). In one embodiment, process parameters of the bonding process between the first and second bonding layers includes a process temperature between about 250 degrees Celsius and about 700 degrees Celsius, a process pressure between about 10 kN and about 90 kN, and a process time between about 5 minutes and about 30 minutes. In one embodiment, process parameters of the bonding process between the second and third bonding layers includes a process temperature between about 200 degrees Celsius and about 500 degrees Celsius, a process pressure between about 10 kN and about 90 kN, and a process time less than about 15 minutes.

In an embodiment, a surface clean is performed prior to the bonding process(es). The surface clean may include a wet etch, a dry etch, or combinations thereof. In an embodiment, a post-bonding thermal process is performed (e.g., anneal).

The method 100 may be used to implement a variety of embodiments. For example, in one embodiment a substantially silicon-based bonding layer is provided on a MEMS substrate and a substantially aluminum-based bonding layer is provided on a CMOS substrate. These substrates, and the bonding layers, are bonded together using the described method. In another embodiment, a substantially silicon-based bonding layer is disposed on a CMOS substrate and a substantially aluminum-based bonding layer is disposed on a MEMS substrate. These substrates, and the corresponding bonding layers, are bonded together using the described method. In yet further embodiments, the methods described herein may be applied to bonding of a plurality of MEMS substrates, a plurality of CMOS substrates, and/or any combination thereof. (It should be noted that while described herein as applied to the bonding of two substrates, the methods and devices described are scalable to bonding any number of substrates.)

Referring now to FIGS. 2A-2G, cross-sectional views are illustrated of a MEMS device at various stages of fabrication according to aspects of the present disclosure. FIG. 2A illustrates a MEMS substrate 200 including a substrate 202 and a first bonding layer 204. In an embodiment, the MEMS substrate 200 and the first bonding layer 204 are substantially as described above with respect to block 102 of method 100.

In particular, MEMS substrate 200 includes a MEMS device or portion thereof. The MEMS substrate may be a silicon wafer including MEMS devices, features and/or functionalities. The MEMS substrate may be a wafer or combination of wafers (including portions thereof) including MEMS features and functionality. The substrate 202 may include silicon or alternatively or additionally include other elementary semiconductor, such as germanium. The substrate 202 may also include a compound semiconductor, such as silicon carbide, gallium arsenic, indium arsenide, indium phosphide, or the like.

In an embodiment, the first bonding layer 204 includes silicon. Examples of the first bonding layer compositions include amorphous silicon, polysilicon, a combination of amorphous silicon and polysilicon, silicon doped with one or more impurities, and other suitable substantially silicon-based compositions. The first bonding layer 204 may be formed by physical vapor deposition (PVD), chemical vapor deposition (CVD), evaporation, electron beam evaporation (E-gun), ion beam, energy beam, combinations thereof, and/or other suitable deposition processes. The doping may be performed in order to enhance the electrical performance of the associated device (e.g., to decrease the bias). Example impurities include boron, phosphorus, arsenic, and/or other suitable dopants known in the art.

In an embodiment, the first bonding layer 204, or portion thereof, may be a substantially silicon-based layer as noted above. For example, the substantially silicon-based layer may include amorphous silicon and/or polysilicon. In an embodiment, the first bonding layer 204 is an amorphous silicon layer which is pre-treated (e.g., prior to bonding) with a thermal process (e.g., anneal process). The thermal process may convert the layer or portion thereof to a polysilicon layer. In an alternative embodiment, the first bonding layer may be a substantially aluminum-based layer. In other embodiments, the first bonding layer may be comprised of titanium, nickel, silicon, alloys thereof, or combinations thereof. In an embodiment, the first bonding layer is formed and subsequently or concurrently doped with impurities.

In one embodiment substrate 202 has a thickness greater than about 5 microns, and in another embodiment substrate 202 has a thickness greater than about 50 microns. Advantageously, the present disclosure allows for the capping of thick MEMS structures as opposed to traditional methods and techniques which have been limited to thin MEMS layers, such as layers below about 5 microns.

Figure 2B:
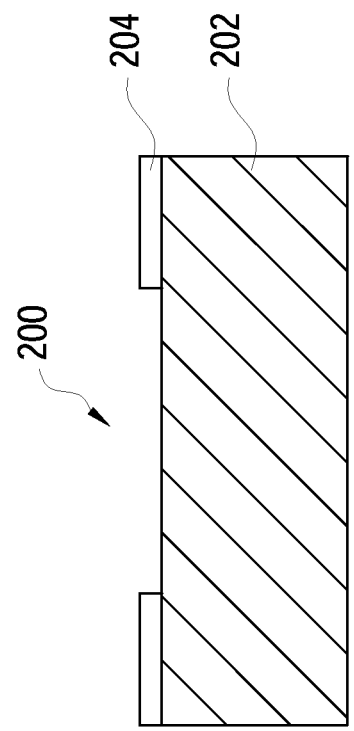

FIG. 2B illustrates the first bonding layer 204 after being patterned. The pattern is designed to interface, physically and/or electrically, with a semiconductor substrate, such as a CMOS substrate at a plurality of bonding regions. The etch of the first bonding layer 204 may include photolithography processing and/or etching to pattern the bonding layer.

In one embodiment, the MEMS substrate and/or the CMOS substrate are cleaned prior to a bonding process. The cleaning process may include a wet etch/clean and/or dry etch processes. Example wet etch/clean processes include exposure to hydrofluoric acid (HF) including dilute HF. Example dry etch processes include argon sputtering and plasma etch processes. The cleaning process may include other suitable processes such as de-ionized water rinses and drying processes (e.g., spin dry). The clean may serve to de-oxidize the bonding layer(s).

Figure 2C:
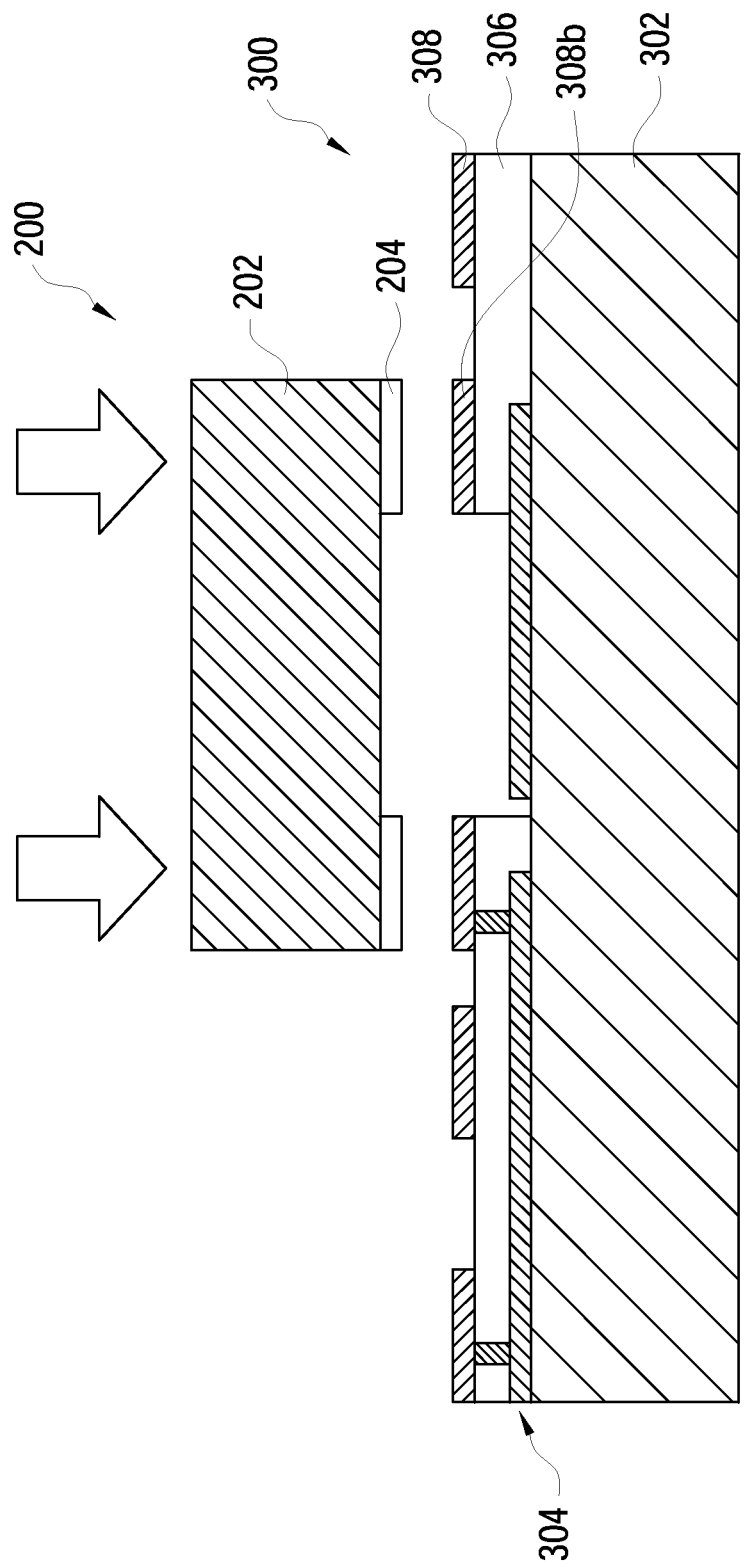

FIG. 2C illustrates the bonding of the MEMS substrate 200 to a semiconductor substrate 300, which in one embodiment includes a substrate 302, a MLI 304, an insulating layer 306 (e.g., interlayer dielectric (ILD)), and a second bonding layer 308. In particular, the first bonding layer 204 of the MEMS substrate 200 is bonded to the second bonding layer 308 of the semiconductor device 300. The bonding creates bonding regions which provide physical coupling of the substrates, which may include mechanical and/or electrical coupling between the substrates. In an embodiment, one or more bonding regions (e.g., bonding region 309a in FIG. 2D) provide an electrical interface between the semiconductor substrate 300 and the MEMS substrate 200 or the devices formed thereon.

In an embodiment, the semiconductor substrate 300 and the second bonding layer 308 are substantially as described above with respect to block 104 of method 100. In particular, the semiconductor substrate 300 provided includes a semiconductor device such as an integrated circuit (IC) including a metal-insulator-semiconductor field effect transistor (MOSFET) including complementary MOSFET (CMOS), a CMOS imaging sensor (CIS), a MEMS, and/or other suitable active and/or passive devices. In an embodiment, the semiconductor substrate 300 includes an IC (or portion thereof) designed and formed by a CMOS-based processes. This may be referred to herein as a CMOS substrate or CMOS device. The CMOS substrate may be any substrate (e.g., wafer) with one or more semiconductor devices implemented (e.g., designed and fabricated) by a CMOS-based technology formed thereon. A semiconductor substrate including a device formed using other semiconductor fabrication technologies is also within the scope of the described method and present disclosure.

In one example, the substrate 302 is a silicon wafer. The substrate 302 may alternatively or additionally include other elementary semiconductor, such as germanium. The substrate 302 may also include a compound semiconductor, such as silicon carbide, gallium arsenic, indium arsenide, indium phosphide, or the like. The semiconductor substrate 300 typically includes a plurality of features formed thereon providing a semiconductor device or portion thereof.

In an embodiment, the second bonding layer 308 includes aluminum. Example compositions of the second bonding layer include an aluminum alloy with copper, an aluminum alloy with copper and silicon, and/or other suitable substantially aluminum-based compositions. The substantially aluminum-based second bonding layer may be formed by CVD, physical vapor deposition (sputtering), plating, and/or other suitable processes. Other manufacturing techniques to form the bonding layer may include photolithography processing and/or etching to pattern the bonding layer. In an embodiment, the second bonding layer 308, or portion thereof, is part of a multilayer interconnect (MLI) structure 304 of a semiconductor device. The MLI 304 includes horizontal conductive features (metal lines) disposed at multiple metal layers and vertical conductive features, such as contacts and vias. A via is configured to connect two metal lines at different metal layers. A contact is configured to connect a metal line and the substrate.

In an embodiment, the second bonding layer is formed as part of a semiconductor device disposed on the CMOS substrate (e.g., is part of an MLI). In an embodiment, the second bonding layer 308 may be a substantially aluminum-based layer as noted above. In alternative embodiments, the second bonding layer 308 may be comprised of titanium, nickel, copper, gold, silver, indium, tin, alloys thereof, or combinations thereof. In yet another embodiment, the second bonding layer 308 may be a substantially silicon-based layer.

As illustrated in FIG. 2C, the second bonding layer 308 is a patterned layer. The pattern is designed to interface with the MEMS substrate (e.g., electrically and physically) at a plurality of bonding regions. FIG. 2C also illustrates the second bonding layer 308 includes a portion 308b that is disposed on an insulating layer 306. The insulating layer 306 may include a dielectric material such as silicon oxide, silicon nitride, silicon oxynitride, spin-on glass (SOG), low k material, fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The insulating layer 306 may be formed by a method such as spin-on coating, CVD, and/or other suitable processes.

The bonding may be performed by a commercially available wafer bonder, in one embodiment to form a eutectic or diffusion bond between the first and second bonding layers. In an embodiment, the process temperature for the bonding is between about 250 degrees Celsius and about 700 degrees Celsius. In an embodiment, the process time is between about 5 minutes and about 30 minutes. In an embodiment, the bonding pressure is between about 10 kN and about 90 kN. These process parameters are exemplary only. The bonding may be performed in a controlled atmosphere (e.g., in the presence of a forming gas). Example forming gases include Ar, N2, $H_2$, He, $N_2/H_2$, and combinations thereof. An alignment process is typically performed prior to the bonding.

Figure 2D:
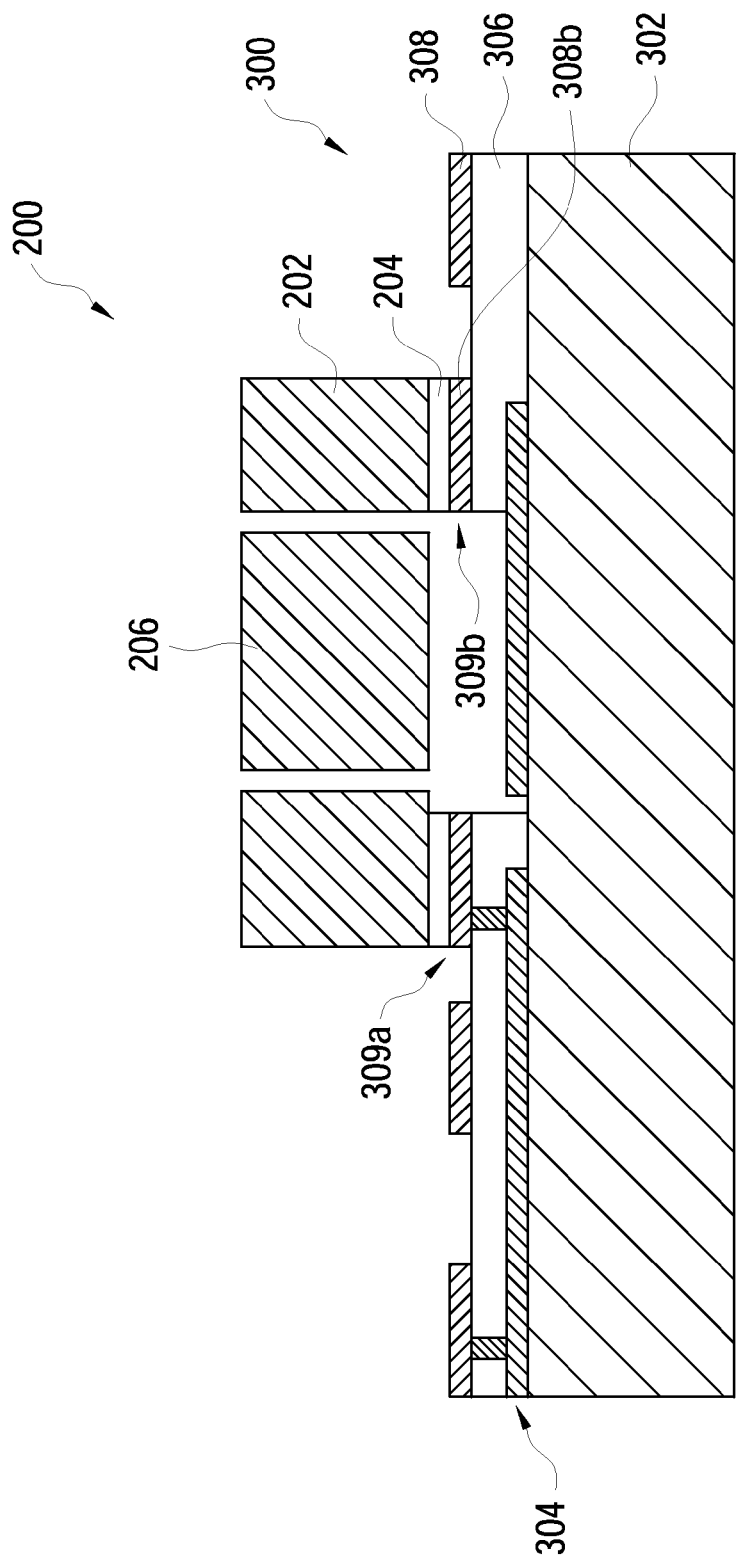

FIG. 2D illustrates the coupled first and second bonding layers 204, 308 such that an interface between the two layers is provided (e.g. bonding region). In one example, the first bonding layer 204 and the second bonding layer 308 may be comprised of a titanium aluminum alloy and aluminum respectively, nickel and aluminum respectively, silicon and aluminum respectively, or silicon and titanium respectively.

The bonding regions formed by the first and second bonding layers 204, 308 may provide an electrical interface in addition to mechanical coupling. For example, a bonding region 309a illustrates an electrical coupling but bonding region 309b illustrates a mechanical coupling only. The bonding layer 308b is disposed on the insulating material 306 of the semiconductor substrate 300. The bonded substrates 200 and 300 may then be annealed. Example process conditions for the anneal process include a temperature between approximately 400 degrees Celsius and approximately 500 degrees Celsius.

FIG. 2D also illustrates an etch of the MEMS substrate 202 to form a proof mass 206, which may provide a reference mass that is used to measure the variable to which the MEMS device is directed. The MEMS substrate 202 may be etched by a variety of patterning and etch techniques known in the art, such as one of various deep reactive ion etch (DRIE) and photolithographic patterning and etch techniques.

Figure 2E:
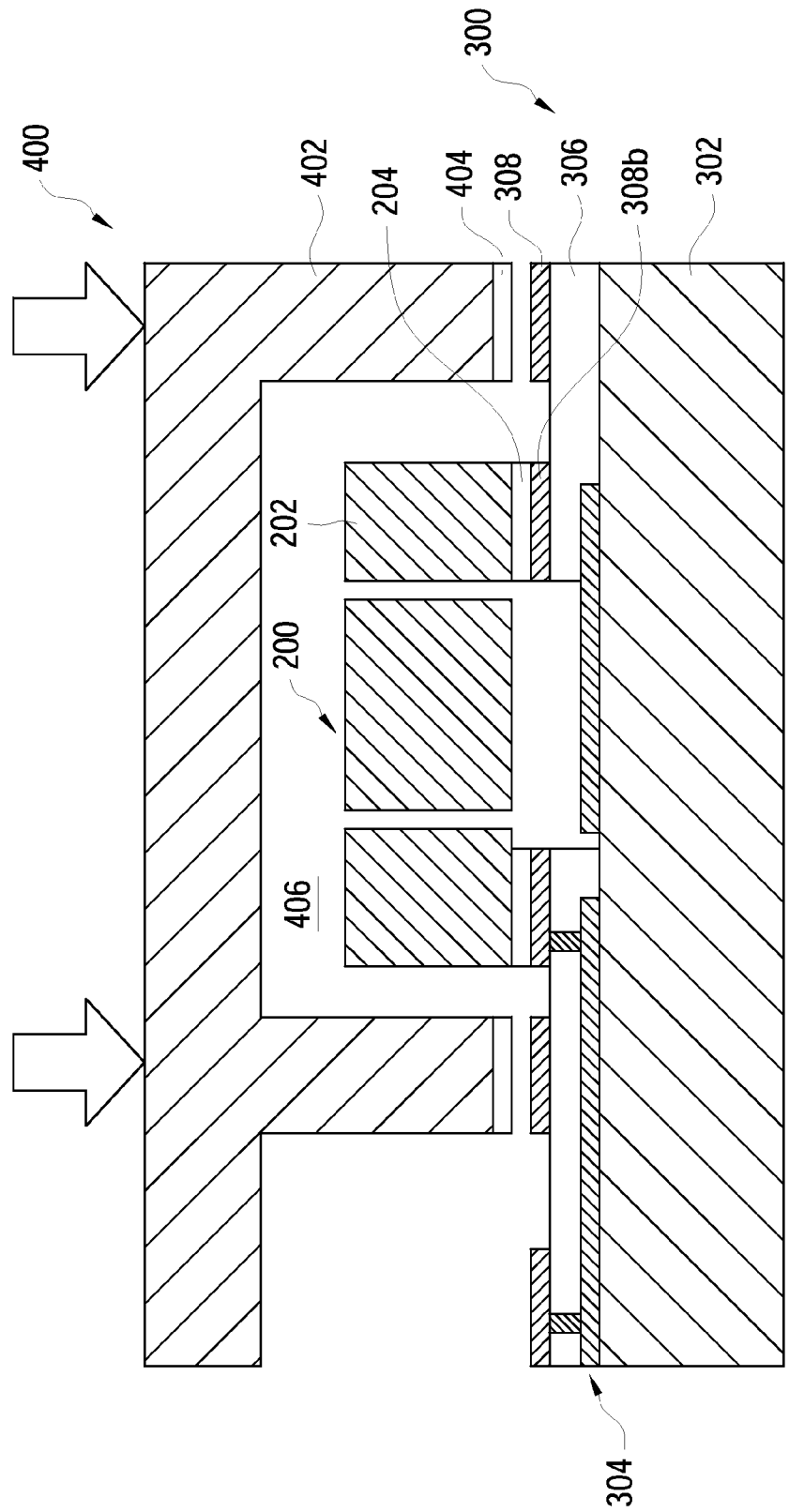

FIG. 2E illustrates the bonding of semiconductor substrate 300 to a cap 400, which in one embodiment includes stand-off features 402 and a third bonding layer 404. In particular, the third bonding layer 404 of the cap 400 is bonded to the second bonding layer 308 of the semiconductor device 300. The stand-off feature 402 may be configured to provide an appropriate cavity 406 to enclose the MEMS substrate 200. The bonding creates bonding regions which provide physical/mechanical coupling of the MEMS substrate and the cap to hermetically seal MEMS substrate 200 within cavity 406 created by the coupled cap 400 and semiconductor substrate 300.

In an embodiment, the cap 400 and the third bonding layer 404 are substantially as described above with respect to block 106 of method 100. In particular, in one embodiment, the cap 400 does not include an integrated circuit. The cap 400 may be comprised of silicon or other elementary semiconductor, such as germanium. The cap 400 may also be comprised of a compound semiconductor, such as silicon carbide, gallium arsenic, indium arsenide, indium phosphide, and the like.

In an embodiment, the third bonding layer 404 includes silicon. Examples of the third bonding layer compositions include amorphous silicon, polysilicon, a combination of amorphous silicon and polysilicon, silicon doped with one or more impurities, and other suitable substantially silicon-based compositions. The third bonding layer may be formed by physical vapor deposition (PVD), chemical vapor deposition (CVD), evaporation, electron beam evaporation (E-gun), ion beam, energy beam, combinations thereof, and/or other suitable deposition processes. Other manufacturing techniques used to form the third bonding layer may include photolithography processing and/or etching to pattern the bonding layer. In other embodiments, the third bonding layer may be comprised of germanium. In an embodiment, the third bonding layer 404 includes silicon, germanium, or combinations thereof.

The bonding may be performed by a commercially available wafer bonder, in one embodiment to affect a eutectic bond between the second and third bonding layers. In an embodiment, the process temperature for the bonding is between about 200 degrees Celsius and about 500 degrees Celsius. In an embodiment, the process time is less than about 15 minutes. In an embodiment, the process pressure is between about 10 kN and about 90 kN. These process parameters are exemplary only. The bonding may be performed in a controlled atmosphere (e.g., in the presence of a forming gas). Example forming gases include Ar, N2, $H_2$, He, $N_2/H_2$, and combinations thereof. An alignment process is typically performed prior to the bonding. In an alternative embodiment, the cap may be bonded to the semiconductor substrate by an adhesive bond, e.g., between benzocyclobutene (BCB)/polyimide (PI) bonding layers.

Figure 2F:
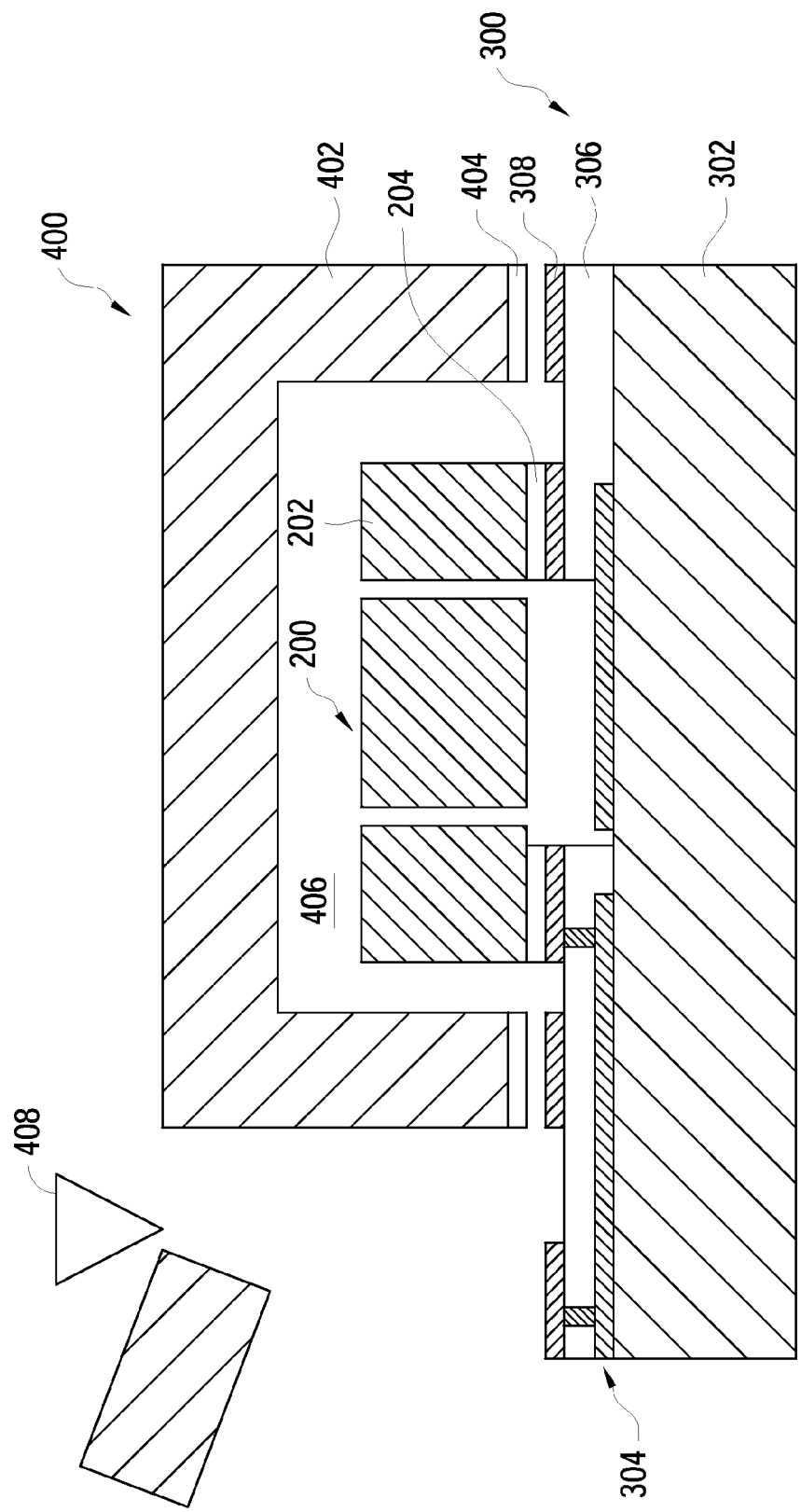

FIG. 2F illustrates the coupled second and third bonding layers 308, 404 and then a subsequent cutting of a portion of the cap 400, in one example by a die saw 408. In one example, the second bonding layer 308 and the third bonding layer 404 may be comprised of aluminum and germanium respectively, an aluminum copper alloy and germanium respectively, a gold alloy and silicon respectively, a silver alloy and silicon respectively, an indium alloy and silicon respectively, or a tin alloy and silicon respectively.

Figure 2G:
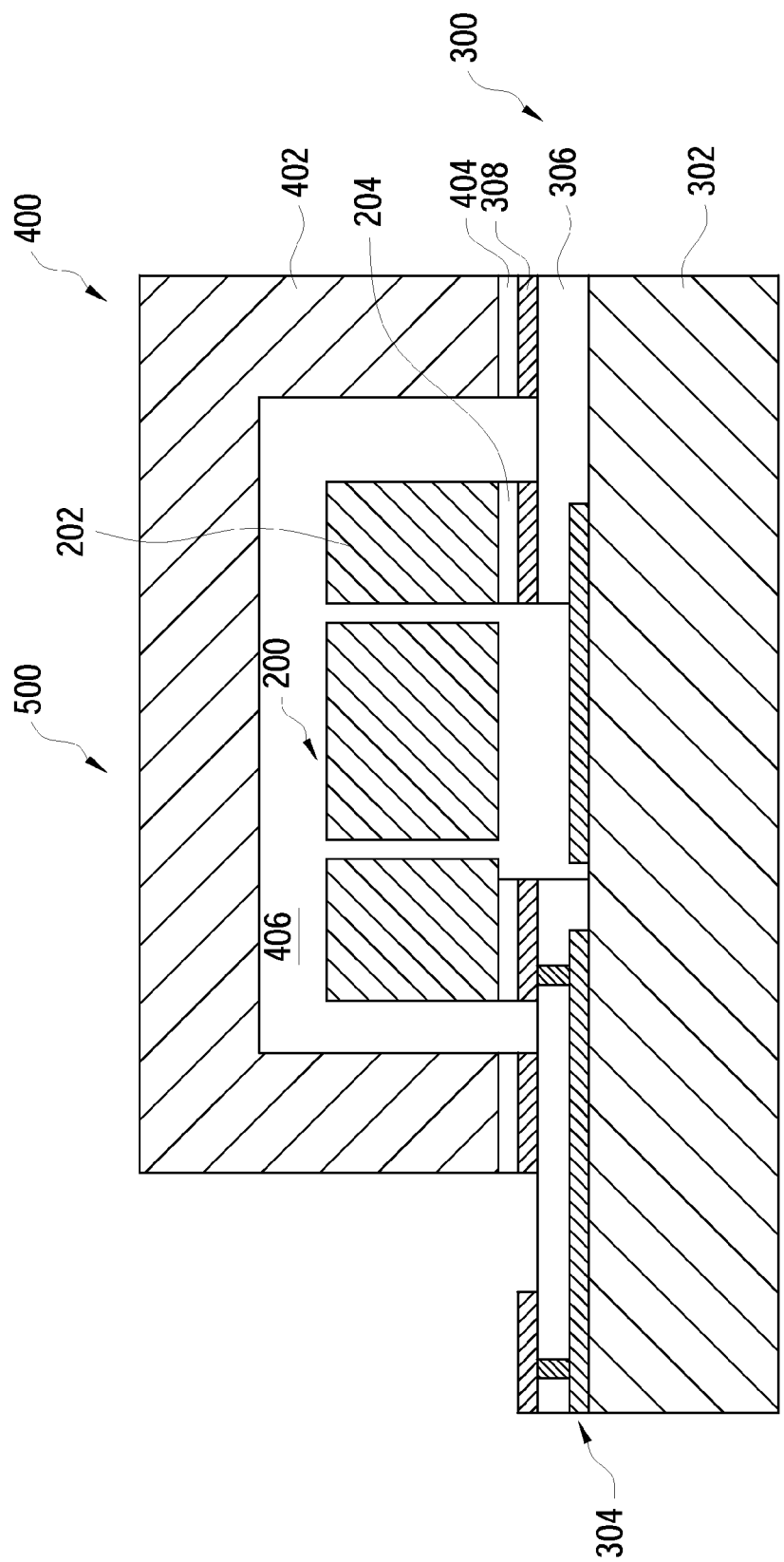

FIG. 2G illustrates a MEMS device 500 including the MEMS substrate 200 bonded to the semiconductor substrate 300 to provide electrical and/or mechanical coupling between the substrates, and the cap 400 bonded to the semiconductor substrate 300 to hermetically seal the MEMS substrate 200 within cavity 406.

Figure 3:
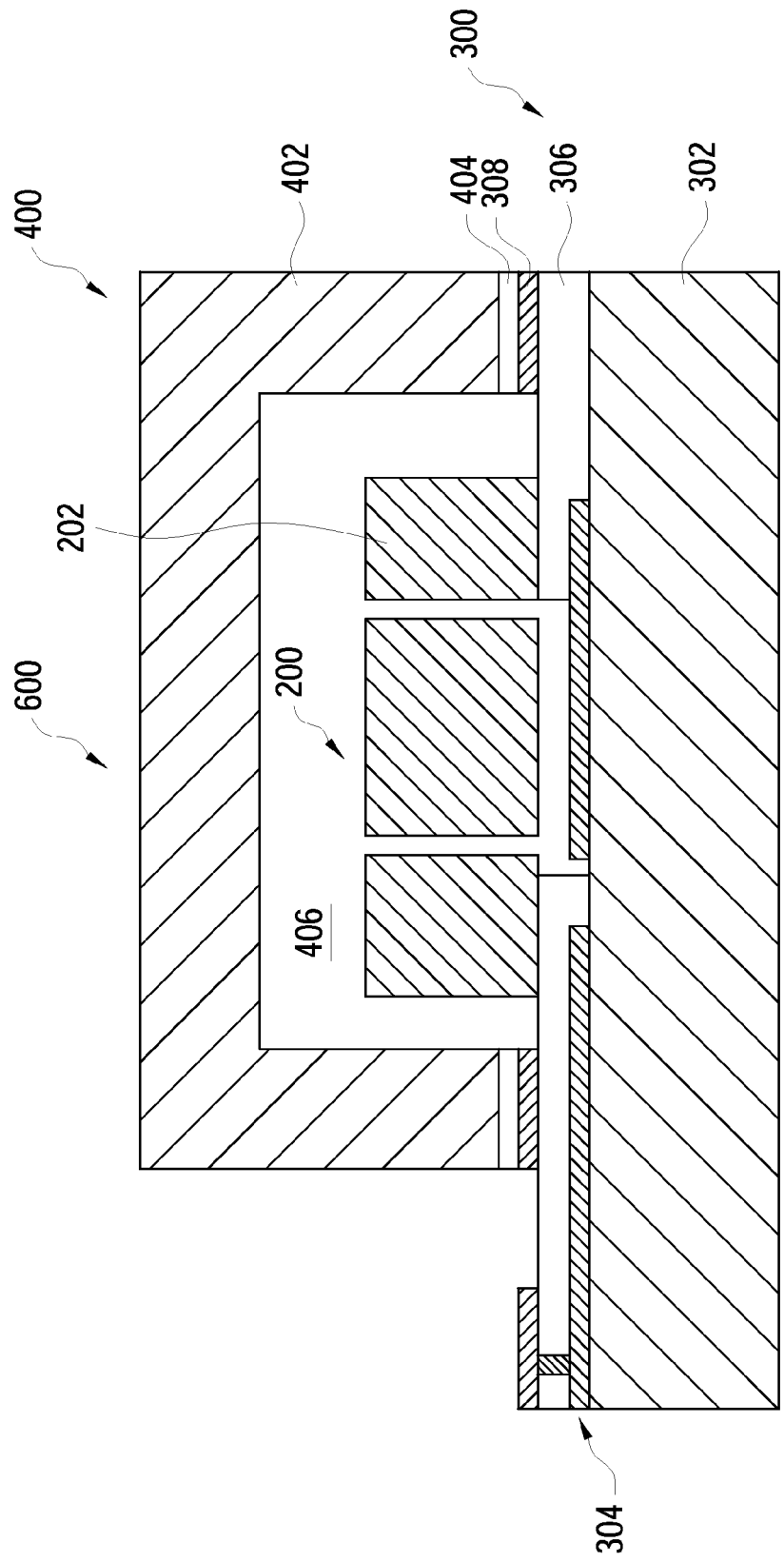
FIG. 3 is a cross-sectional view of a MEMS device according to another embodiment of the present disclosure.

Referring now to FIG. 3, another MEMS device 600 is illustrated including the MEMS substrate 200 bonded to the semiconductor substrate 300 to provide electrical and/or mechanical coupling between the substrates, and the cap 400 bonded to the semiconductor substrate 300 to hermetically seal the MEMS substrate 200 within cavity 406. Similar processes, structures, and features as those described above with respect to FIGS. 1 and 2A-2G are fully applicable in this embodiment and redundant descriptions will not be repeated. In this embodiment, MEMS substrate 200 does not include a distinct bonding layer but instead substrate 202 is fusion bonded to the insulating layer 306 of semiconductor device 300. In one embodiment, substrate 202 is comprised of silicon and insulating layer 306 is comprised of silicon oxide. In one embodiment, bonding process parameters include a process temperature between about 20 degrees Celsius and about 200 degrees Celsius, a process time less than about 10 minutes, and a process pressure less than 5 kN.

Figure 4:
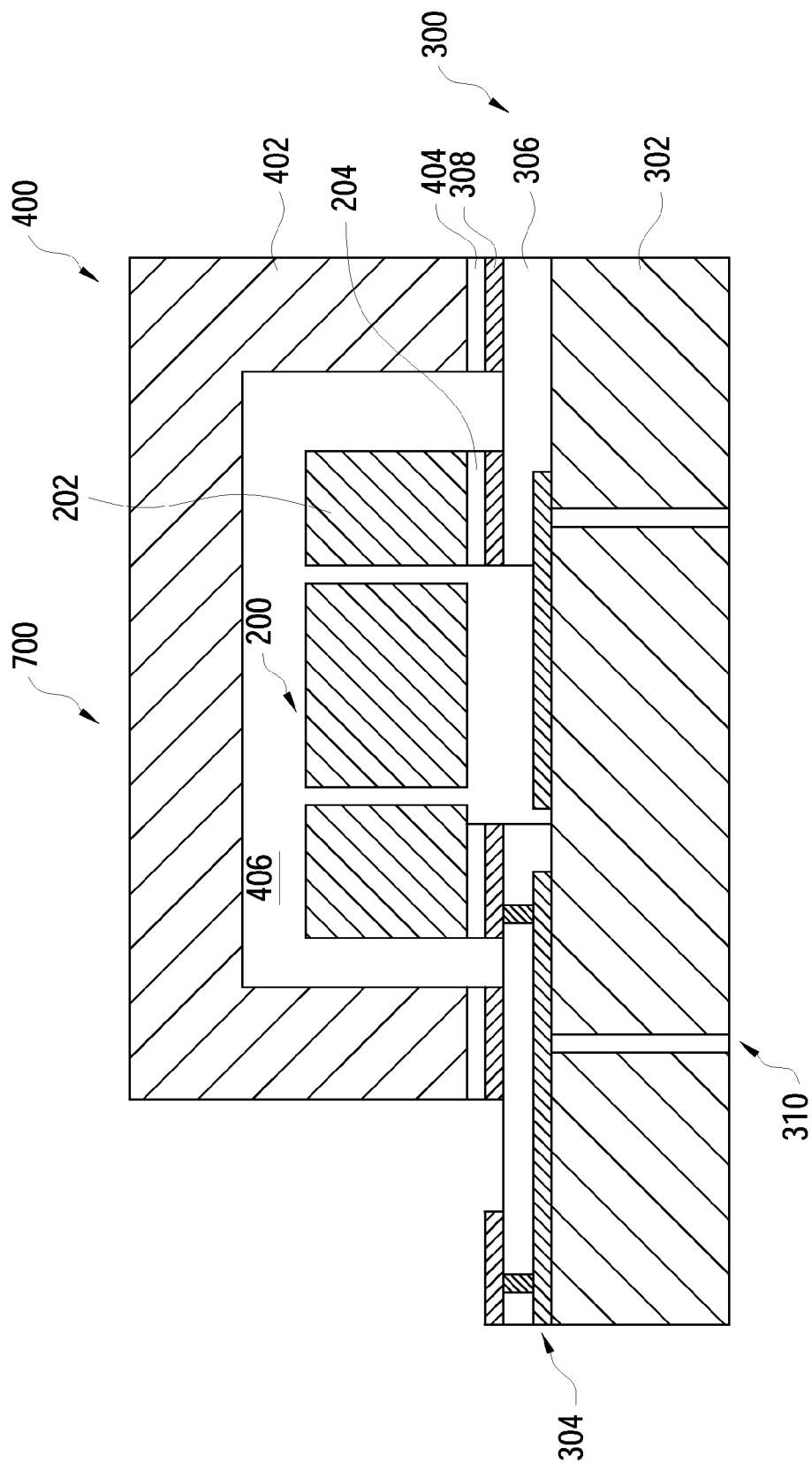
FIG. 4 is a cross-sectional view of a MEMS device according to yet another embodiment of the present disclosure.

Referring now to FIG. 4, another MEMS device 700 is illustrated including the MEMS substrate 200 bonded to the semiconductor substrate 300 to provide electrical and/or mechanical coupling between the substrates, and the cap 400 bonded to the semiconductor substrate 300 to hermetically seal the MEMS substrate 200 within cavity 406. Similar processes, structures, and features as those described above with respect to FIGS. 1 and 2A-2G are fully applicable in this embodiment and redundant descriptions will not be repeated. In this embodiment, semiconductor substrate 300 includes an interconnect 310, which is disposed through substrate 302 and connected to a bottom layer of MLI 304.

One or more of the described embodiments may provide advantages over the prior art. The multiple bonding of the present disclosure allows for the creation of a robust electrical and mechanical interface between substrates while reducing leakage pathways. A first bonding process provides mechanical and/or electrical connection between substrates, and another bonding process provides a cavity and seal to cap the MEMS device, thereby separating different requirements of bonding. Such a bonding scheme allows for the use of optimized materials for conductivity, bond strength, or other purposes separately from consideration of hermeticity. Furthermore, such a bonding scheme allows for the use of CMOS compatible materials (e.g., aluminum which is standard within a CMOS process). Therefore, in an embodiment, wafer-level bonding can be achieved without the addition of any process layers to a CMOS substrate. Furthermore, the present packaging scheme allows for thick microstructures to be capped with a single structure cap by a single interface which provides for a robust device with less leakage pathways.

Although the embodiments illustrated herein may describe and/or illustrate a single bonding layer deposited on a substrate, this is not required and any plurality of layers may be patterned to form one or more bonding regions between substrates.

Thus, the present disclosure provides a method for fabricating a MEMS device including multiple bonding of substrates. In one embodiment, a method includes providing a micro-electro-mechanical systems (MEMS) substrate including a first bonding layer, providing a semiconductor substrate including a second bonding layer, and providing a cap including a third bonding layer. The method further includes bonding the MEMS substrate to the semiconductor substrate at the first and second bonding layers, and bonding the cap to the semiconductor substrate at the second and third bonding layers to hermetically seal the MEMS substrate between the cap and the semiconductor substrate.

The present disclosure also provides a MEMS device. In one embodiment, the device includes a micro-electro-mechanical systems (MEMS) substrate including a first bonding layer, a semiconductor substrate including a second bonding layer, the MEMS substrate electrically coupled to the semiconductor substrate by a bond at the first and second bonding layers. The device further includes a cap including a third bonding layer, the cap coupled to the semiconductor substrate by a bond at the second and third bonding layers, wherein the MEMS substrate is hermetically sealed between the cap and the semiconductor substrate.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A method, comprising:
providing a micro-electro-mechanical systems (MEMS) substrate including a first bonding layer, wherein the first bonding layer comprising silicon;
providing a semiconductor substrate including a second bonding layer;
providing a cap including a third bonding layer;
bonding the first bonding layer of the MEMS substrate to the second bonding layer of the semiconductor substrate; and
bonding the third bonding layer of the cap to the second bonding layer of the semiconductor substrate to hermetically seal the MEMS substrate between the cap and the semiconductor substrate.

2. The method of claim 1, wherein the semiconductor substrate includes an integrated circuit formed using a complementary metal-oxide semiconductor (CMOS) process.

3. The method of claim 1, wherein the second bonding layer is comprised of a material selected from aluminum, titanium, nickel, copper, gold, silver, indium, tin, or combinations thereof.

4. The method of claim 1, wherein the third bonding layer is comprised of a material selected from germanium, silicon, or combinations thereof.

5. The method of claim 1, wherein bonding the MEMS substrate to the semiconductor substrate occurs via fusion bonding.

6. The method of claim 1, wherein the MEMS substrate includes a proof mass etched from the MEMS substrate after bonding the MEMS substrate to the semiconductor substrate.

7. The method of claim 1, wherein the second bonding layer is part of a multilayer interconnect (MLI) of the semiconductor substrate, and further wherein the MEMS substrate and the cap are bonded to a top layer of the MLI.

8. The method of claim 7, further comprising forming an interconnect to a bottom layer of the MLI through the semiconductor substrate.

9. The method of claim 1, wherein the silicon comprises amorphous silicon, polysilicon, a combination of amorphous silicon and polysilicon, or silicon doped with one or more impurities.

10. The method of claim 1, wherein the second bonding layer comprises aluminum and the third bonding layer comprises germanium.

11. A method, comprising:
providing a micro-electro-mechanical systems (MEMS) device including a first bonding layer, wherein the first bonding layer comprising silicon;
providing a complementary metal-oxide semiconductor (CMOS) device including a second bonding layer;
providing a cap including a third bonding layer;
bonding the first bonding layer of the MEMS device to the second bonding layer of the CMOS device to electrically couple the MEMS device to the CMOS device; and
bonding the third bonding layer of the cap to the second bonding layer of the CMOS device to hermetically seal the MEMS device between the cap and the CMOS device.

12. The method of claim 11, wherein the second bonding layer is comprised of a material selected from aluminum, titanium, nickel, copper, gold, silver, indium, tin, or combinations thereof.

13. The method of claim 11, wherein the third bonding layer is comprised of a material selected from germanium, silicon, or combinations thereof.

14. The method of claim 11, wherein the silicon comprises amorphous silicon, polysilicon, a combination of amorphous silicon and polysilicon, or silicon doped with one or more impurities.

15. A method, comprising:
providing a micro-electro-mechanical systems (MEMS) substrate including a first bonding layer, wherein the first bonding layer comprising silicon;
providing a semiconductor substrate including a second bonding layer;
electrically coupling the semiconductor substrate to the MEMS substrate by bonding the first and second bonding layers;
providing a cap including a third bonding layer; and
coupling the cap to the semiconductor substrate by bonding the second and third bonding layers,
wherein the MEMS substrate is hermetically sealed between the cap and the semiconductor substrate.

16. The method of claim 15, wherein the second bonding layer is comprised of a material selected from aluminum, titanium, nickel, copper, gold, silver, indium, tin, or combinations thereof.

17. The method of claim 15, wherein the third bonding layer is comprised of a material selected from germanium, silicon, or combinations thereof 18. The method of claim 15, wherein the second bonding layer is part of a multilayer interconnect (MLI), and further wherein the MEMS substrate and the cap are bonded to a top layer of the MLI.

19. The method of claim 15, wherein the silicon comprises amorphous silicon, polysilicon, a combination of amorphous silicon and polysilicon, or silicon doped with one or more impurities.

20. The method of claim 15, wherein the second bonding layer comprises aluminum and the third bonding layer comprises germanium.

* * * * *